(12) United States Patent
Werth et al.

(10) Patent No.: US 10,845,433 B2
(45) Date of Patent: *Nov. 24, 2020

(54) MAGNETIC FIELD SENSOR ARRANGEMENT AND METHOD FOR PROCESSING A MAGNETIC FIELD SENSOR OUTPUT SIGNAL

(71) Applicant: Infineon Technologies AG, Neubiberg (DE)

(72) Inventors: Tobias Werth, Villach (AT); Catalina-Petruta Juglan, Bucharest (RO)

(73) Assignee: Infineon Technologies AG (DE)

( * ) Notice: Subject to any disclaimer, the term of this patent is extended or adjusted under 35 U.S.C. 154(b) by 0 days.

This patent is subject to a terminal disclaimer.

(21) Appl. No.: 16/583,854

(22) Filed: Sep. 26, 2019

(65) Prior Publication Data

US 2020/0025838 A1 Jan. 23, 2020

Related U.S. Application Data

(63) Continuation of application No. 15/492,577, filed on Apr. 20, 2017, now Pat. No. 10,466,310.

(30) Foreign Application Priority Data

Apr. 20, 2016 (DE) .................. 10 2016 206 686

(51) Int. Cl.
*G01R 33/00* (2006.01)
*G01R 33/07* (2006.01)
*G01D 5/244* (2006.01)

(52) U.S. Cl.
CPC ..... *G01R 33/0029* (2013.01); *G01R 33/0041* (2013.01); *G01R 33/0088* (2013.01); *G01R 33/07* (2013.01); *G01D 5/2448* (2013.01)

(58) Field of Classification Search
CPC ............ G01R 33/0029; G01R 33/0088; G01R 33/07; G01D 5/2448
See application file for complete search history.

(56) References Cited

U.S. PATENT DOCUMENTS

| 7,492,149 B2 | 2/2009 | Motz et al. |
| 9,500,465 B2 | 11/2016 | Rolew et al. |

(Continued)

FOREIGN PATENT DOCUMENTS

| DE | 10223767 A1 | 12/2003 |
| DE | 102010064201 A1 | 6/2012 |

(Continued)

OTHER PUBLICATIONS

Kusuda, Yoshinori. "Auto Correction Feedback for Ripple Suppression in a Chopper Amplifier". IEEE Journal of Solid-State Circuits, vol. 45, No. 8, (2010), pp. 1436-1445.

(Continued)

*Primary Examiner* — Gregory J Toatley, Jr.
*Assistant Examiner* — Terence E Stifter, Jr.
(74) *Attorney, Agent, or Firm* — Design IP

(57) ABSTRACT

A magnetic field sensor arrangement includes a magnetic field sensor element configured to provide a sensor output signal responsive to a magnetic field, wherein the sensor output signal is representative of a magnetic field amplitude; a processing module configured to provide a processed sensor output signal representative of the sensor output signal; a switching level calculation module configured to calculate a switching level, (1) during a power up mode, based on a default switching level, and (2) during a running mode, based on the processed sensor output signal; a comparator module configured to compare the processed sensor output signal with the switching level, and to provide a comparator output signal based on the comparison; and a (Continued)

storage module configured to store the default switching level, provide the default switching level during the power up mode, and update the default switching level during the running mode.

25 Claims, 5 Drawing Sheets

(56) References Cited

U.S. PATENT DOCUMENTS

| | | | |
|---|---|---|---|
| 10,102,992 B2 | 10/2018 | Werth et al. | |
| 2003/0225539 A1 | 12/2003 | Motz et al. | |
| 2006/0119348 A1* | 6/2006 | Blossfeld | F02D 41/009 |
| | | | 324/166 |
| 2013/0177040 A1* | 7/2013 | Foletto | G01D 5/142 |
| | | | 374/142 |
| 2014/0019084 A1* | 1/2014 | Rolew | G01D 5/145 |
| | | | 702/150 |
| 2014/0077873 A1* | 3/2014 | Motz | H03F 3/387 |
| | | | 330/9 |
| 2014/0222364 A1 | 8/2014 | Foletto et al. | |
| 2014/0266176 A1* | 9/2014 | Fernandez | G01R 1/44 |
| | | | 324/244 |
| 2015/0061656 A1* | 3/2015 | Fernandez | G01B 7/003 |
| | | | 324/207.25 |
| 2015/0243461 A1 | 8/2015 | Werth et al. | |

FOREIGN PATENT DOCUMENTS

| | | |
|---|---|---|
| DE | 102010064203 A1 | 6/2012 |
| DE | 102015102673 A1 | 8/2015 |

OTHER PUBLICATIONS

Motz, Mario, et al. "A Chopped Hall Sensor With Small Jitter and Programmable True Power-On Function". IEEE Journal of Solid-State Circuits, vol. 40, No. 7, (2005), pp. 1533-1540.

Allegro MicroSystems, Inc. "Self-Calibrating TPOS Speed Sensor IC Optimized for Automotive Cam Sensing Application". Worcester, Mass., (2013) pp. 1-13.

* cited by examiner

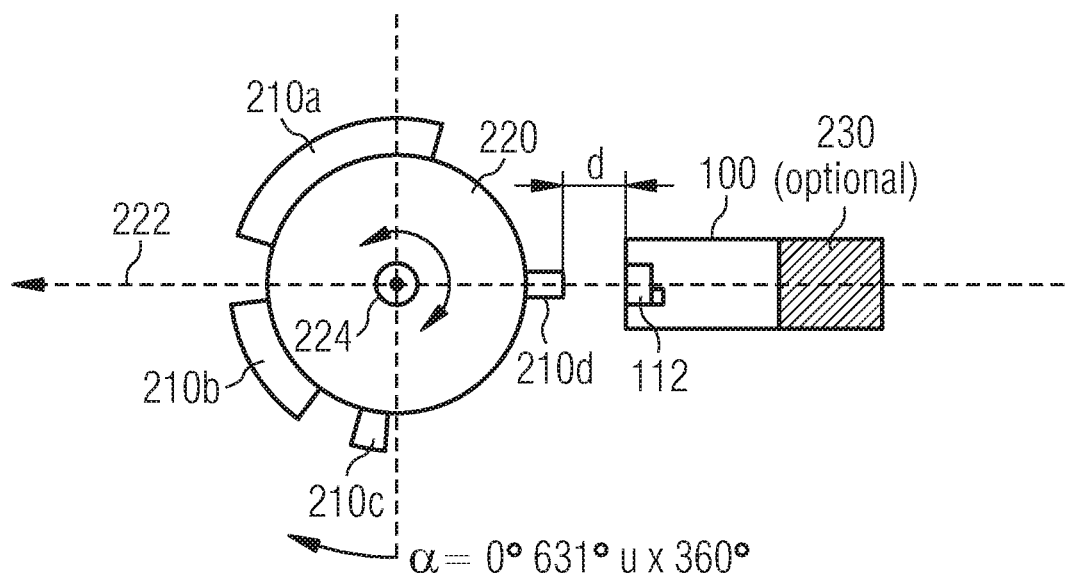

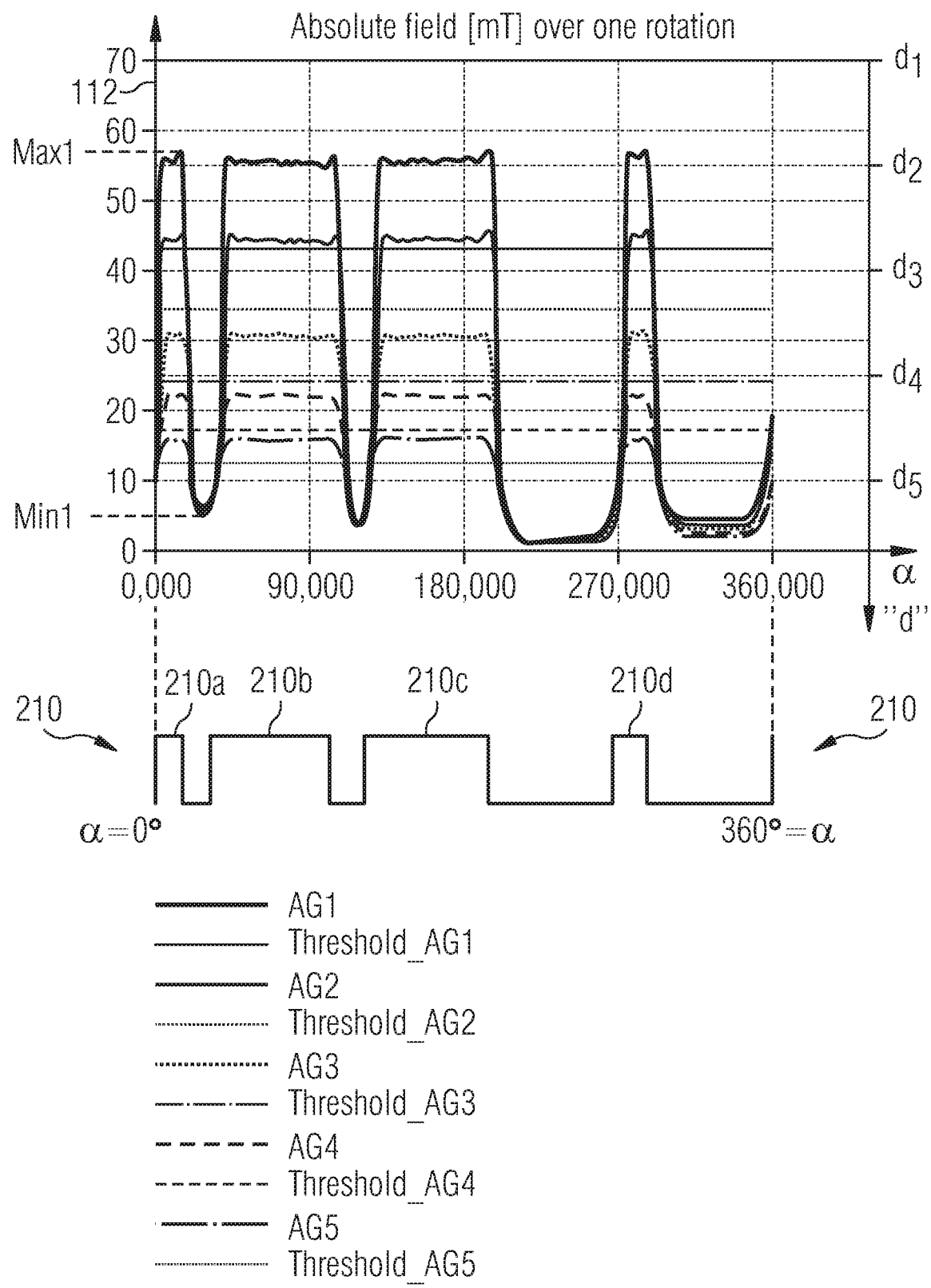

MAGNETIC FIELD SENSOR ARRANGEMENT AND METHOD FOR PROCESSING A MAGNETIC FIELD SENSOR OUTPUT SIGNAL

CROSS-REFERENCE TO RELATED APPLICATIONS

This application is a continuation of U.S. patent application Ser. No. 15/492,577, filed Apr. 20, 2017, which claims the benefit of German Patent Application No. 10 2016 206 686.2 filed Apr. 20, 2016, which are incorporated by reference as if fully set forth.

FIELD

Embodiments relate to a magnetic field sensor arrangement and a method for processing a magnetic field sensor output signal.

BACKGROUND

In many sensors, a certain time is required after a sensor system has been taken into operation until the control system acts and the measurement signal relatively accurately reproduces the quantity to be measured. In sensor systems, e.g., magnetic field sensor arrangement, for detecting the position of mechanical elements, such as for example a Hall sensor for camshaft configurations, it is important, after the operating voltage has been switched on, to detect the position of a mechanical element in order to achieve accurate measurements. In the case of a Hall sensor for camshaft configurations, for example, the position of a camshaft should be detected as accurately as possible after the operating voltage has been switched on, i.e. whether it is a tooth gap (notch) or a tooth of the target wheel which is facing the sensor.

Moreover, in order to compensate for offset components which may result from fluctuating influences, e.g., from unstable mechanical stress voltages of the sensor for temperature dependent circuit parameters, chopper principles may be applied. In particular, the chopper principles provide for a so called true power on (TPO) function of the sensor. A TPO function is understood to be the precise measuring operation immediately after the operating voltage of a sensor system has been switched on, which is of importance, for example, for the precise detection of the position of an idle mechanical element, such as a target wheel (tooth wheel). Chopper principles are suitable for a TPO function since they essentially make it possible to eliminate offset components, which impair the measuring accuracy, from the sensor signal shortly after the operating voltage of a sensor system has been switched on.

SUMMARY

Embodiments relate to a magnetic field sensor arrangement and a method for processing a magnetic field sensor output signal. Some embodiments relate to an auto-TPO-nonvolatile storage of calibration value(s) for cam sensors.

An embodiment provides a magnetic field sensor arrangement comprising: a magnetic field sensor element configured to provide a sensor output signal responsive to a magnetic field, wherein the sensor output signal is representative of a magnetic field amplitude; a processing module configured to process the sensor output signal and to provide a processed sensor output signal which is representative of the sensor output signal; switching level calculation module configured to determine/calculating a switching level, (1) during a power up mode, based on a default switching level, and (2) during a running mode, based on the processed sensor output signal; a comparator module configured to compare the processed sensor output signal with the switching level, and to provide a comparator output signal based on the comparison; and a storage module configured to store the default switching level and further configured (1) to provide, during the power up mode, the default switching level to the switching level calculation module, and (2) to update, during the running mode, the default switching level based on the switching level currently calculated by the switching level calculation module, if a difference between the switching level calculated during the running mode and the stored default switching level is higher than a predetermined percentage of the magnetic field amplitude.

According to a further embodiment, the amplitude of the magnetic field is influenced by a target wheel, wherein the default switching level is only updated during the running mode if the target wheel has reached a predetermined rotational speed which is, for example, higher than at least 100 rpm (rpm=revolutions per minute).

A further embodiments provides a method for processing a magnetic field sensor output signal, comprising: providing the sensor output signal responsive to a magnetic field, wherein the sensor output signal is representative of a magnetic field amplitude; processing the sensor output signal for providing a processed sensor output signal which is representative of the sensor output signal; determining/calculating a switching level, (1) during a power up mode, based on a default switching level, and (2) during a running mode, based on the processed sensor output signal; comparing the processed sensor output signal with the default switching level for providing a comparator output signal based on the comparison; and storing the default switching level and providing, during the power up mode, the default switching level for the switching level calculation step, and (2) updating, during the running mode, the default switching level based on the switching level currently calculated if a difference between the switching level calculated during the running mode and the stored default switching level is higher than a predetermined percentage of the magnetic field amplitude.

Thus, the present concept in form of the magnetic field sensor arrangement and the method for processing a magnetic field sensor output signal provide for an improved detection of the phase accuracy of the first switch edges (based on a sensed magnetic field) after power-on of a magnetic sensor, e.g., a mono-cell magnetic cam sensor, when the sensor is mounted in the operating place, e.g., in a vehicle or car. Moreover, the calibrated switching level are stored/updated when the criteria of frequency and, for example, of deviation are met. Additionally, the chopper stores the ripple feedback for a faster startup of the feedback loop.

To be more specific, in accordance with the present concept on the basis the functionality of the magnetic field sensor arrangement and the method for processing a magnetic field sensor output signal, respectively, an updated or calibrated switching level is stored/updated as the (new) default switching level based on the currently calculated switching level (or comparator threshold) when specific criteria of deviation between the default switching level and the currently calculated switching level are met. Moreover, the frequency or rotational speed of the monitored camshaft may be considered as further criterion for storing/updating the default switching level based on the currently calculated switching level (threshold). To achieve a sufficient accuracy after power on, the sensor arrangement stores the new default switching level, i.e. the newly calibrated switching level, which forms the default switching level during normal operation mode, if the currently stored switching level deviates more than 3% (e.g., more than 5% or 10%) from the ideal (i.e. the currently stored default) switching level compared to the detected peak-to-peak amplitude of the rendered or processed sensor output signal. Moreover, the calibrated switching level may optionally be stored/updated during the running mode only if the target wheel has a higher rotational speed than at least 100 rpm. Updating the default switching level only if the target wheel has achieved a minimum rotational speed is conducted to suppress the possibility to store wrong calibration values (default switching levels) generated by a high target wheel vibration (as the higher the rotational speed of the target wheel is the lower the effect to the calculated switching level is).

The number of self-programming operations (updates of the default switching level) can be stored incrementally and can be limited to a maximum number of, e.g., 10. Additionally, the chopper circuit may store the ripple feedback for a faster startup of the feedback of the feedback loop. To be more specific, as the chopper offset is stored, a more stable and faster restart of the ripple feedback suppression may be achieved.

Further, a "watchdog" (i.e. a device/circuitry that detects faults and initiates corrective actions) for a small signal detection may be implemented to recover for the case that at small signals after remount at a high air gap the sensor does not switch anymore. This may occur when the complete processed sensor signal is below the default switching level. At a wrong/missing switching detection, a fallback TPO implementation can be activated. Another option may be to activate the calibration storage by a digital command applied with the supply modulation when the sensor is mounted.

Furthermore, the number of teeth of the target wheel can also be learned at the first power on. This makes the device more universal and the customer does not program anything. Alternatively, a fixed number of, e.g., 12, teeth can be assumed as this covers target wheels with 1, 2, 3, 4, 6 and 12 teeth which are the most common.

BRIEF DESCRIPTION OF THE DRAWINGS

Various embodiments are described herein making reference to the appended drawings and figures.

FIG. 3A shows schematic circuit diagram of a magnetic field sensor arrangement according to one or more embodiments;

FIG. 3B shows an example graph showing different example sensor output signals responsive to a magnetic field influenced by a target wheel having four teeth according to one or more embodiments.

DETAILED DESCRIPTION

Before discussing the embodiments in further detail using the drawings and figures, it is pointed out that in the figures and the specification identical elements and elements having the same functionality and/or same technical or physical effect are usually provided with the same reference number or identified with the same name/term, so that the description of these elements and of the functionality thereof as illustrated in the different embodiments are mutually exchangeable and may be applied to one another in the different embodiments.

In the following description, embodiments are discussed in detail, however, it should be appreciated that the different embodiments provide many applicable concepts that can be embodied in a wide variety of magnetic field sensor arrangements. The specific embodiments discussed are merely illustrative of specific ways to make and use the present concept, and do not limit the scope of the claims. In the following description of embodiments, the same or similar elements having the same function have associated therewith the same reference signs or the same name/term, and a description of such elements will not be repeated for every embodiment. Moreover, features of the different embodiments described hereinafter may be combined with each other, unless specifically noted otherwise.

Figure 1:
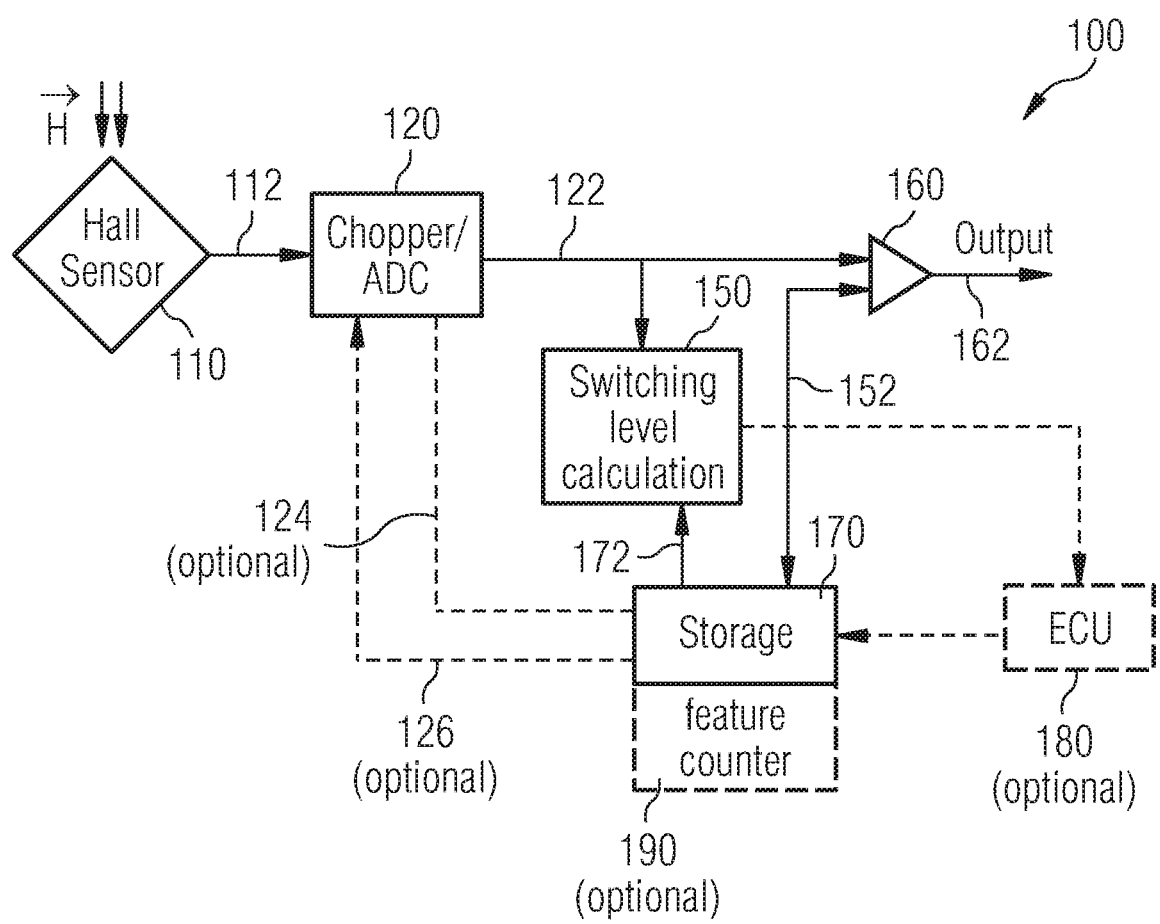
FIG. 1 shows a schematic block diagram illustrating a magnetic field sensor arrangement according to one or more embodiments.

FIG. 1 shows a schematic block diagram illustrating a magnetic field sensor arrangement 100 according to an embodiment. The magnetic field sensor arrangement 100 is configured to be operated in at least two different modes or operation modes, wherein a first or initial operation mode after power up will be referred to as "power up mode" or as "initial mode" (e.g., true power on state (TPOS)). The operation following the initialization will be referred to as "running mode", i.e. a normal operation with a running target wheel. In this connection, it is pointed to the fact that further "intermediate operation modes" between the power up mode and the running mode may be provided for providing a smooth transition between the initial power up mode and the running mode (normal operation mode).

The magnetic field sensor arrangement 100 comprises a magnetic field sensor element 110 which is configured to provide a sensor output signal 112 responsive to a (external) magnetic field $\vec{H}$, the sensor output signal 112 having an amplitude based on the strength of the magnetic field component to which the magnetic field sensor element is responsive and which passes through the magnetic field sensor element 110. The sensor output signal 112 is illustrative or representative of the magnetic field amplitude and/or magnetic field absolute value, but may also contain overlaid signal path offset ripple. Thus, the sensor output signal 112 may provide an analog representation of the (sensed) magnetic field amplitude. The magnetic field amplitude may be the peak-to-peak amplitude of the sensed (absolute) magnetic field or an amplitude signal derived therefrom. Thus, the peak-to-peak amplitude is the change between peak (highest amplitude value) and trough (lowest amplitude value). Thus, the magnetic field amplitude is computed as the difference between these maxima and minima of the magnetic field. Thus, the sensor arrangement 100 is able to follow the variations of the magnetic field and is able to detect local minima and local maxima value.

The magnetic field sensor element 110 may comprise, but it is not limited to, a Hall effect element, a magneto-resistance element, or a magneto-transistor. A Hall effect element may comprise, for example, a planar Hall element, a vertical Hall element or a circular Hall element. Magneto-resistive (XMR) sensor elements may comprise any magneto-resistive structures such as AMR (anisotropic magneto-resistance) structures, GMR (giant magneto-resistance)

structures or TMR (tunnel magneto-resistance) structures or magnetic tunnel junction (MTJ) structures. To summarize, the term "magnetic field sensor element" is used to describe a variety of electronic elements that can sense a magnetic field for a magnetic field component. Thus, the magnetic field sensor element may be suited for camshaft applications, so that its basic function may be to map either a tooth or a notch into a unique electrical output state, i.e. an amplitude or an amplitude information.

The magnetic field sensor arrangement further comprises a processing module 120 which is configured to receive and process the sensor output signal 112, and further to provide a processed sensor output signal 122 which is representative of the sensor output signal 112. The processed sensor output signal 122 is an amplified and/or digitized (digital) representation of the (e.g., analog) sensor output signal 112. To be more specific, the sensor output signal 112 is representative of the magnetic field amplitude and/or magnetic field absolute value, but may also contain overlaid signal path offset ripple, whereas the processed sensor output signal 122 maintains or provides the magnetic field amplitude and offset information, but the signal path offset ripple component is reduced. Thus, the processed sensor output signal 122 may provide a digital representation of the magnetic field amplitude.

As shown in FIG. 1, the processed sensor output signal 122 is provided to a switching level calculation module 150 and to a comparator module 160. The switching level calculation module is configured to calculate a switching level 152 (e.g., in the form of a switching level signal 152) based on the (sensed) magnetic field amplitude, and to provide the currently calculated switching level 152 to the comparator module 160 and to a storage module 170. During the power up mode (TPOS) the switching level calculation module 150 is configured to calculate the current switching level based on a default switching level 172 provided (e.g., as a default switching level signal 172) by the storage module 170 to the switching level calculation module 150. The switching level calculation module 150 is further configured to calculate the switching level 152 during the running mode (normal operation mode of the magnetic field sensor arrangement 100) based on the processed sensor output signal 122.

The comparator module 160 which receives the processed signal output signal 122 as a first input signal and the switching level 152 as a second input signal is configured to compare the processed sensor output signal 122 with the default switching level 152, and to provide a comparator output signal 162 (as the output signal of the sensor arrangement 100) based on the comparison between the first and second input signals 122 and 152. The comparator output signal 162 may form the output signal of the magnetic field sensor arrangement 100. The comparator module 160 can be configured to provide a comparison result (e.g., as the comparator output signal 162) according to a switching algorithm that includes a hysteresis concept. A visible or hidden hysteresis concept can be applied. The hidden hysteresis concept can be also half hidden, wherein the sensor continues to switch even if one of the hidden thresholds is not crossed.

As already indicated above, the storage module 170 is configured to store the default switching level and is further configured (1) to provide, during the power up mode, the default switching level 172 to the switching level calculation module 150, and (2) to update, during the running mode, the default switching level 172 based on the switching level 152 currently calculated by the switching level calculation module 150, if a relative difference between the switching level calculated during the running mode and the stored default switching level 172 is larger than 3% (e.g., larger than 5% or 10%), i.e. if a difference between the switching level 152 calculated during the running mode and the stored default switching level 172 is higher than 3% of the magnetic field amplitude.

To be more specific, during the power up mode (initial mode) the magnetic field amplitude information is provided in the form of the processed (e.g., chopped and/or amplified) sensor output signal 122. The threshold information comes during the power up mode as the default switching level 172 from the storage module 170 which may be for example implemented as a nonvolatile PROM-register (PROM=programmable read-only memory) that may be programmed only a limited number of times. The magnetic signal information 122 is compared by means of the comparator module 160 against the default switching level (default threshold) 172, wherein the output state 162 (the comparator output signal 162) is set correspondingly. Some hysteresis may be introduced by the comparator module 160 in order to avoid false switching due to noise in the processed sensor output signal 122.

Furthermore, the switching level calculation module 150 searches for a minimum value (e.g., caused by a notch of a target wheel) and a maximum value (e.g., caused by a tooth of the target wheel) in the processed sensor output signal 122. Once the switching level calculation module 150 has found a pair of min-max values (a peak-to-peak amplitude) the switching level calculation module 150 calculates an associated switching level. After a certain number of switching events, e.g., based on at least one revolution of the target wheel, the accuracy of the calculated switching level 152 is considered to be sufficiently high so that the operation mode of the magnetic field sensor arrangement 100 is switched from the power up mode to the running mode.

In order to provide a high accuracy of the comparator output signal 162 (e.g., preferably immediately) after power on, the storage module 170 is configured to update, during the running mode, the default switching level 172 which is currently stored in the storage module 170 on the basis of the "new" switching level 152 currently calculated by the switching level calculation module 150, if the switching level 152 calculated during the running mode deviates more than 3%, e.g., more than 5% or 10%, (when compared to the currently detected peak-to-peak amplitude) from the currently stored default switching level (or ideal switching level) 172, i.e. from the default switching level which has been provided during the preceding power up mode from the storage module 170 to the switching level calculation module 150.

The magnetic field to which the magnetic field sensor element responds and on the basis thereof provides the sensor output signal 112 may be influenced by a target wheel. The storage module 170 is further configured to update the default switching level during the running mode, only if the target wheel has a higher rotational speed than at least 100 rpm (e.g., 200, or 400 rpm). Thus, the storage module 170 is further configured to update the default switching level during the running mode, only if the target wheel has reached a predetermined rotational speed which is, for example, higher than at least 100 rpm.

To be more specific, the default (calibrated) switching level 172 is only updated and stored if a rotational speed of at least 100 rpm of the target wheel is detected. The updating of the default switching level 172 only during the running mode and when reaching a predetermined rotational speed is conducted to suppress the possibility to store wrong calibration values generated by target wheel vibration(s), as possible target mean vibrations have a less negative effect on the switching level calculation with an increasing rotational speed of the target wheel. Also, storing/updating (the default switching level 172) at a higher rotational speed reduces the risk of storing during engine start-stop when the tooth-notch information in the magnetic signal may be corrupted.

The storage module 170 is further configured to conduct only a number of incremental update operations of the default switching level, which is smaller than a preset number N, wherein N is equal or smaller than 20 (or 15 or 10, for example). Thus, the number of self-programming of the storage module 170 can be stored incrementally and can be limited to a maximal number of, e.g., 20, 15 or 10 etc. A warning signal may be output or a flag may be set by the storage module 170, if the preset number N of update operations is achieved or exceeded. The warning signal may indicate a possible malfunction of the magnetic field sensor arrangement 100.

The processing module 120 of the magnetic field sensor arrangement 100 may comprise a chopper circuit (not explicitly shown in FIG. 1) with a chopper offset calculation module in a chopper feedback loop, wherein the chopper-offset calculation module is configured (1) to provide, during the running mode, a correction signal, which is based on an offset signal/component in the processed sensor output signal 122, and (2) to feed the correction signal into the chopper feedback loop for at least partially suppressing the offset signal/component in the processed sensor output signal 122.

The storage module 170 may be further optionally configured to store a correction value based on the correction signal 124 and to provide, during the next power up mode(s), the stored correction value 126 to the chopper-offset-calculation module of the processing module 122. The chopper-offset-calculation module may be further optionally configured to use the stored correction value 126 as a starting value for the correction signal during the next power up mode(s). The chopper-offset-calculation module may be further configured to feed the correction signal 124 into the chopper feedback loop for a ripple feedback suppression in the processed sensor signal 122. To be more specific, storing the chopper offset (as correction value) in the storage module 170 and providing the stored chopper offset during the (next) power up mode allows for a faster stabilization at a restart of the ripple feedback suppression of the chopper circuit of the processing module 122.

The storage module 170 may be configured to store the switching level as calculated by the switching level calculation module 150 during the (first) running mode as the (first) default switching level.

The magnetic field sensor arrangement 100 may further optionally comprise an ECU (electronic control unit) 180, wherein the ECU 180 may instruct the storage module 170 to update, during the running mode, the default switching level 172 based on the switching level 152 calculated by the switching level calculation module 150. The (optional) ECU 180 may be configured to instruct the storage module 170 during the first power up mode to update the default switching level 172 based on the switching level 152 calculated by the switching level calculation module 150 to the subsequent running mode. Based on this approach, mechanical tolerances with respect to a distance between the magnetic field sensor arrangement 100 and especially the magnetic field sensor element 110 to the target wheel (not shown in FIG. 1) can be considered, e.g., after installation of the magnetic field sensor arrangement 110 into its operation site.

The optional ECU 180 can also give a trigger command to the storage module 170 without the ECU 180 necessarily knowing the switching level 152 to be programmed as default switching level. The trigger command can be given by the ECU 180 before a programming voltage which might be needed by the storage module 170 is applied externally. Thus, the ECU 180 may be configured to instruct the storage module 170 to update the default switching level 172 when an external programming voltage is applied.

Alternatively, the programming voltage might be provided by internal circuitry, e.g., a charge pump (not shown in FIG. 1), in the device 100. Thus, the ECU 180 may be configured to instruct the storage module 170 to update the default switching level 172 when external conditions are considered safe for programming to be done based on an internal programming voltage coming from a charge pump.

The processing module 120 may further optionally comprise a tracking ADC (ADC=analog-digital-converter) which is configured to provide a digital representation in the form of the processed sensor output signal 122 of the sensor output signal 112, i.e. of the magnetic field amplitude. As indicated above, the magnetic field sensor element 110 may comprise a Hall sensor element, however any sensor elements responsive to a magnetic field component can be used.

Furthermore, the switching level calculation module 150 may be configured to determine a number of teeth or notches e.g., within a range of 1 to 12 (but not limited to 12) of the target wheel during the running mode and to store this information in the storage module 170.

The storage module 170 can be configured to store an individual switching level 152 for each feature, e.g., tooth, notch or edge, of the target wheel, and to provide the (different) individual switching levels to the switching level calculation module 150 so that the switching level calculation module 150 may be configured to calculate/determine the switching level 152 based on the individual default switching levels for each feature of the target wheel.

The magnetic field sensor arrangement 100 may further optionally comprise a feature counter 190 for determining a current position of the target wheel. A feature of the target wheel may be a tooth, a notch or an edge at the target wheel, wherein the optional feature counter 190 may determine the current position of the target wheel based on the correlation between stored individual switching level and calculated individual switching level.

The switching level calculation module 150 may be further configured to calculate at start up an individual switching level (threshold) of the current feature and to compare the currently calculated individual switching level of the current feature with the stored individual default switching levels (thresholds) in order to match the content of the feature counter 190 with the current position of the target wheel.

Thus, the feature counter 190 may receive information from the switching level calculation module 150 regarding events of detection of minimum and maximum values.

In case, the feature counter 190 is configured to count the teeth on a target wheel, a register (not shown in FIG. 1) is incremented on each detection of a new maximum and the register is reset when the complete target wheel rotation has finished according to a programmed number of teeth on the target wheel. Alternatively, the feature counter 190 can increment a register at each maximum detection event and each minimum detection event. Alternatively, the feature counter 190 can receive information from the comparator module 160 regarding output switching events. The feature counter 190 can be configured to increment a register each time a switching event is observed in the comparator module by associating a switching event with a magnetic edge.

The reset of the register in the feature counter can be configured to occur at the end of each target wheel rotation. The feature counter 190 may determine the rotational speed of the target wheel. Alternatively, the feature counter 190 may provide information for an rpm counter (not shown in FIG. 1) which determines the rotational speed of the target wheel.

In case the different, individual switching levels are used on each feature of the target wheel, the storage module 170 may be further configured to store all default switching levels, i.e. the respective default switching levels for each feature, e.g., tooth, edge or notch, and may be further configured (1) to provide, during the power up mode, the default switching levels 170 to the switching level calculation module 150, and (2) to update, during the running mode, the default individual switching levels 172 based on the switching level currently calculated by the switching level calculation module 150, if a difference between the switching level currently calculated during the running mode and the stored default switching level for the (determined) feature of the target wheel is higher than 3% of the magnetic field amplitude (in the sensor output signal). The storage module 170 may be further configured to update the stored default switching level only after a defined number of target wheel rotations, e.g., of at least 10, 100 or 500 rotations, in order to prevent a writing of wrong values in functional testing scenarios. Thus, the storage module 170 may be configured to update of the stored default switching level 172 only when the calculated switching level 152 has remained (essentially) unchanged for a defined number of target wheel rotations. Furthermore, the storage module 170 may be configured to provide a flag or a programmed validity field in the storage unit 170 which indicates if the update of the default switching level (threshold) in the storage module 170 occurred in a "safe supply condition".

When the self-triggered programming occurs in a non-controlled environment (e.g., in field programming inside the engine) it is possible that the engine is stopped and the device is powered down before the programming procedure is finished. It is also possible that a short voltage drop occurs on the supply line during programming procedure even if the engine is not stopped (micro-break). In case supply is lost during programming procedure, the programmed value could be corrupted. In order to avoid using corrupted data as valid information, the data is stored twice and a stored validity field is associated to each instance of the stored data.

In order to ensure that the entire programming procedure occurred in "safe supply conditions" (without supply interruptions) the programming procedure may contain the following steps:

The validity field for the first instance of stored data is programmed as invalid.

The first instance of the storage data is programmed with the new value.

The validity field for the first instance of stored data is programmed as valid. The validity field for the second instance of stored data is programmed as invalid.

The second instance of the storage data is programmed with the new value.

The validity field for the second instance of stored data is programmed as valid.

In case a supply interruption occurs during programming, the two validity fields would contain different information. In order to improve robustness, the validity field can be considered programmed valid when it contains a pattern for which the probability in case of interrupted programming is reduced. When the device is powered up it uses the instance of the programmed data for which the validity field is programmed as valid.

The storage module 170 may be further configured (during an update of the default switching level) to move the old or discarded default switching level (default threshold value) to a "different" (dedicated) location of the storage module 170 allowing to provide a history or table of the default switching level updates. Thus, the flags or programmed validity fields in the storage module 170 may indicate which of multiple instances of stored default switching level 172 in the storage module 170 can be used as default switching level at start-up.

The storage module 170 can be further configured to receive a temperature information for the junction temperature of the storage device 170 and to allow programming only within a temperature range that is considered safe for the storage device 170. A safe temperature range may depend on the storage device 170, as for some EEPROMs programming is not guaranteed at temperatures above 150 C or below 0 C, for example. Thus, the storage module 170 may be configured to update of the stored default switching level 172 only when the measured temperature is considered safe for the programming of the storage device.

The storage module 170 can be further configured to only allow programming of the default switching level 172 when the currently calculated switching level 152 has been stable for multiple consecutive target wheel rotations (for example, at least 2, 4, 6, 8 . . . rotations). This ensures robustness against programming of a wrong default switching level 172 due to a disturbance on the processed sensor output signal 122. This disturbance can be caused for example by an EMC event (EMC=Electromagnetic Compatibility), by stray field disturbance or by the passing of a metal particle through the air-gap between the device and the target wheel.

Figure 2:
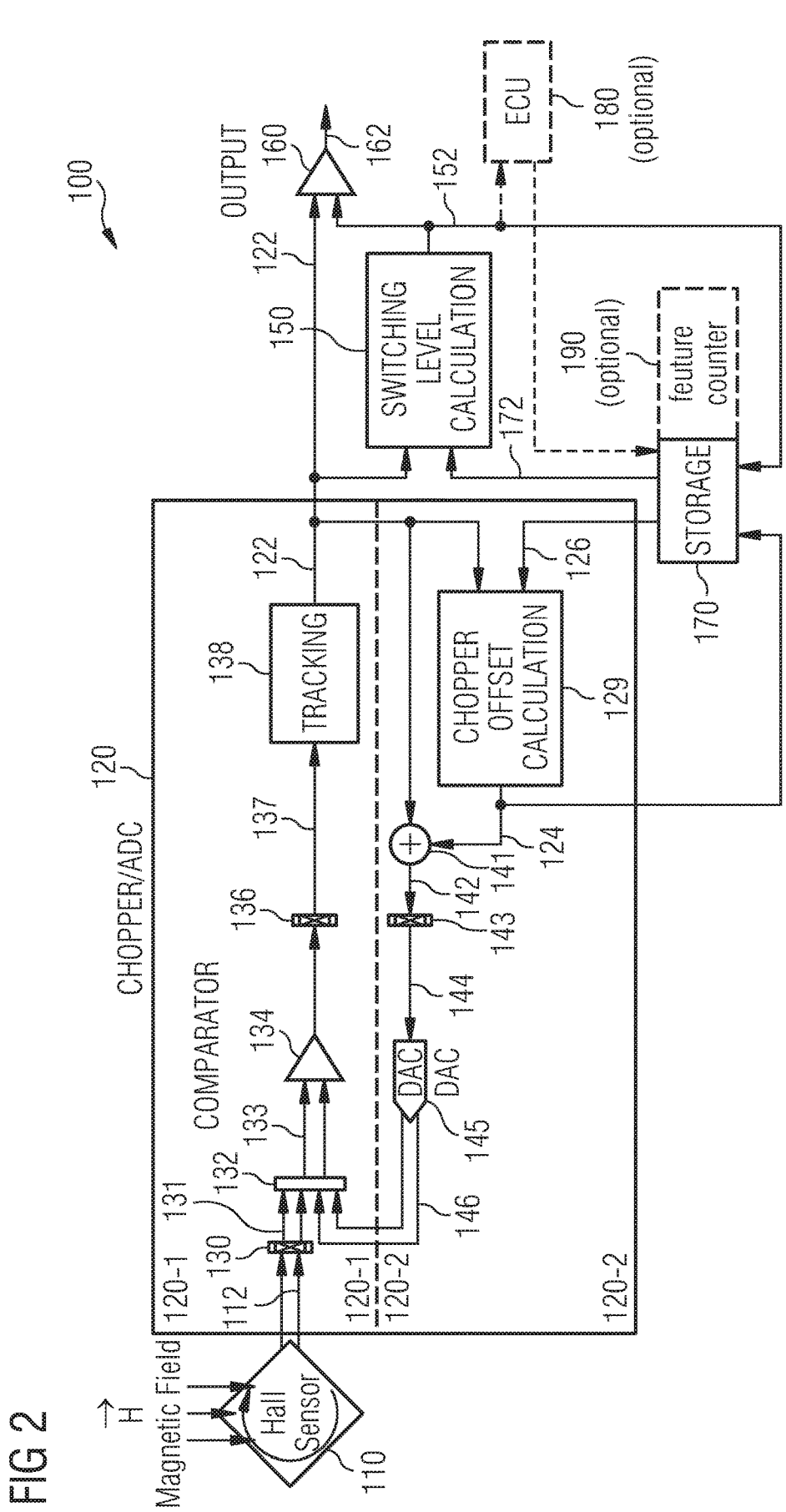
FIG. 2 shows a schematic block diagram illustrating a magnetic field sensor arrangement according to one or more embodiments.

Referring now to FIG. 2, showing a schematic circuit or block diagram of the magnetic field sensor arrangement 100, wherein a possible implementation of the processing module 120 is illustrated in more detail. The remaining circuit elements, such as the magnetic field sensor element 110, the switching level calculation module 150, the comparator module 160, the storage module 170, the optional ECU 180 and the optional feature counter 190 correspond to the elements as described with respect to the magnetic field sensor arrangement 100 of FIG. 1 and having (essentially) the same functionality and/or the same technical or physical effect so that the description of these elements and of the functionality thereof as illustrated in the embodiment of FIG. 1 are mutually exchangeable and may be applied to the elements of the magnetic field sensor arrangement of FIG. 2.

As shown in FIG. 2, the magnetic field sensor arrangement 100 may comprise a Hall sensor as the magnetic field sensor element 110 to provide a sensor output signal 112 responsive to a magnetic field H. The Hall sensor element 110 may be implemented as a Hall plate having n*4 terminals, for example. An excitation current for the Hall plate 110 is impressed into two opposite terminals. At the other two opposite terminals, the Hall voltage is picked up or sensed. The Hall plate is operated in accordance with the spinning Hall principle (Spinning Current principle) as shown by the arrow in the Hall plate 110. According to this principle, the connections of the Hall plate are cyclically exchanged at a predetermined clock rate, i.e. the excitation current is impressed at a first pair of terminals during one clock period and a second pair of terminals, arranged at an angle of about 90°/n with respect to the first pair of terminals, in a subsequent clock period. The connections for picking up the Hall voltage are correspondingly exchanged. Offset components in the signal of the Hall plate, particularly alternating-voltage error signals, can be reduced, in particular by adding the Hall voltages sensed in successive clock periods.

The sensor output signal 112 is provided to the processing module 120. As shown in FIG. 2, the processing module 120 comprises a main signal path 120-1 and a (auto-correction) feedback loop 121 e.g., for a ripple feedback suppression.

The sensor output signal 112 is provided to a first chopping circuit 130 (input chopping circuit), wherein the chopping circuit 130 chops the sensor output signal 112 in response to a chopping clock signal, wherein the resulting chopped signal 131 is provided to a modulator 132. The modulator 132 is used for rotating the connections of the Hall plate 110 in accordance with the spinning Hall principle. For this purpose, the modulator 132 is operated with the chopper cycle. The chopper cycle determines the frequency with which the connections of the Hall plate are exchanged.

The modulator output signal 133 is provided to a comparator (or differential amplifier) 134. The output signal 135 of the comparator 134 is provided to a second chopping circuit 136 which converts the output signal 135 of the comparator 134 back to a DC signal 137. The DC signal 137 is provided to a tracking ADC 138 which is configured to provide a digital representation of the DC signal 137, and thus of the sensor output signal 122. The output signal 122 of the tracking ADC 138 (which is also the output signal of the processing module 120) is also fed to the chopper feedback loop 120-2. The chopper feedback loop 120-2 comprises a chopper offset calculation module 139 for providing a correction signal 124 at a combination point 141 into the feedback loop. In the combination point 141, the processed sensor output signal 122 and the correction signal 124 are combined, e.g., added. The resulting feedback signal 142 is provided to a further chopping circuit 143 which chops the feedback signal 143 in response to the chopping clock, wherein the resulting chopped signal 144 is provided to a DAC 145 (DAC—digital-analog-converter). The DAC 145 provides a DAC output signal 146 as an analog version of the feedback signal 144 to the modulator 134.

The processing module 120 of the magnetic field sensor arrangement 100 comprises the chopper offset calculation module 139 in the chopper feedback loop 120-2, wherein the chopper-offset calculation module 139 is configured (1) to provide, during the running mode, a correction signal 124, which is based on an offset signal or offset component in the processed sensor output signal 122, and (2) to feed the correction signal 124 into the chopper feedback loop for at least partially suppressing the offset signal or offset component in the processed sensor output signal 122.

The storage module 170 may be further configured to store a correction value 126 based on the correction signal 124 and to provide, during the next power up mode(s), the stored correction value 126 to the chopper-offset-calculation module 139 of the processing module 122. The chopper-offset-calculation module 139 may be further configured to use the stored correction value 126 as a starting value for the correction signal during the next power up mode(s). The chopper-offset-calculation module 139 may be further configured to feed the correction signal 124 into the chopper feedback loop 120-2 for a ripple feedback suppression in the processed sensor signal 122. To be more specific, storing the chopper offset (as correction value) in the storage module 170 and providing the stored chopper offset during the (next) power up mode allows for a more stable restart of the ripple feedback suppression of the chopper circuit of the processing module 122.

The processing module 120 may further comprise the tracking ADC 138 (ADC=analog-digital-converter) which is configured to provide a digital representation in the form of the processed sensor output signal 122 of the sensor output signal 112. As indicated above, the magnetic field sensor element 110 may comprise a Hall sensor element, however any sensor elements responsive to a magnetic field component can be used.

Referring to FIG. 3A, a schematic block diagram shows the magnetic feed sensor arrangement 100 according to FIGS. 1 and 2, respectively, together with an associated target wheel 220 to be monitored, wherein FIG. 3B shows an example graph illustrating different example sensor output signals responsive to a magnetic field influenced by a target wheel having four teeth, for example.

As shown in FIG. 3A, the magnetic feed sensor arrangement 100 having the magnetic feed sensor element 112 is arranged next to the target wheel 220 to be monitored. The distance d between the magnetic field sensor element 112 and the target wheel 220 may differ due to mechanical installation tolerances so that an increased distance d between the magnetic field sensor element 112 of the magnetic field sensor arrangement 110 may result in a decreased magnetic field strength to be sensed by the magnetic field sensor element 110. Correspondingly, the amplitude of the sensor output signal 112 decreases with a reduced magnetic field component at the magnetic field sensor element 110. This is indicated by the different courses of the sensor output signal 112 and indicated in FIG. 3B with respect to different and increasing distances d.

FIG. 3B shows five different courses AG 1, AG 2, AG 3, AG 4, AG 5 of the sensor output signal 112 with the five associated switching levels Threshold_AG 1, Threshold_AG 2, Threshold_AG 3, Threshold_AG 4, Threshold_AG 5, corresponding to five air-gaps d1 (e.g., 0.5 mm), d2 (e.g., 1.0 mm), d3 (e.g., 1.5 mm), d4 (e.g., 2.0 mm), d5 (e.g., 2.5 mm). The respective switching level "Threshold_AG 1-5" depends on the detected level of minimum field (e.g., Max 1 for AG 1) and maximum field (e.g., Min1 for AG 1) corresponding to the target wheel magnetic pattern 210 at each air-gap d1-5 (e.g., d1). The magnetic field amplitude may be the peak-to-peak amplitude of the sensed (absolute) magnetic field or an amplitude signal derived therefrom. Thus, the peak-to-peak amplitude is the change between peak (highest amplitude value, e.g., Max # for AG #, with #=1 . . . 5) and trough (lowest amplitude value e.g., Min # for AG #, with #=1 . . . 5).

The device 100 can be configured to calculate a switching level at a fixed or variable percentage of the distance between minima and maxima of the detected field which is indicated by the sensor output signal 112. The maximum value taken into consideration for switching level calculation can be an absolute maximum over one target wheel rotation or a function of all the local maxima seen over one target wheel rotation. Similarly, the minimum value taken into consideration for switching level calculation can be an absolute minimum over one target wheel rotation or a function of all the local minima seen over one target wheel rotation.

As shown in FIG. 3A, the magnetic field sensor arrangement 100 comprising the magnetic field sensor element 110 and the associated evaluation circuit 3 may also comprise an optional back-bias magnet 230. Alternatively or additionally, the different features of the target wheel 220 may be magnetic, i.e. may provide an sensible magnetic field component. The magnet 230 may be configured to generate a magnetic field directed along a connection axis 222 to the center of the target wheel 220. The target wheel 220 may comprise a camshaft having at least one feature, the camshaft can be rotatably disposed, for example, upon a rotational axis 224. As illustrated in FIG. 3A, the target wheel 220 comprises four features or cams 210a-d. In operation, as the target wheel (cam wheel) 220 rotates, the features 210a-d determine variations of the magnetic field generated by the back-bias magnet 230. Variations of the magnetic field are sensed by the magnetic field sensor element 112 and result in amplitude changes (state transitions) in the sensor output signal 112.

With respect to the target wheel of FIG. 3A, it should be noted that the provision of four cam features is only an example as any number of features can be arranged on the target wheel 220. As shown in FIG. 3B, the cam features 210a-d result in the amplitude changes of the signal courses of the sense magnetic field component over one rotation, i.e. from α=0°-360°.

Figure 4:
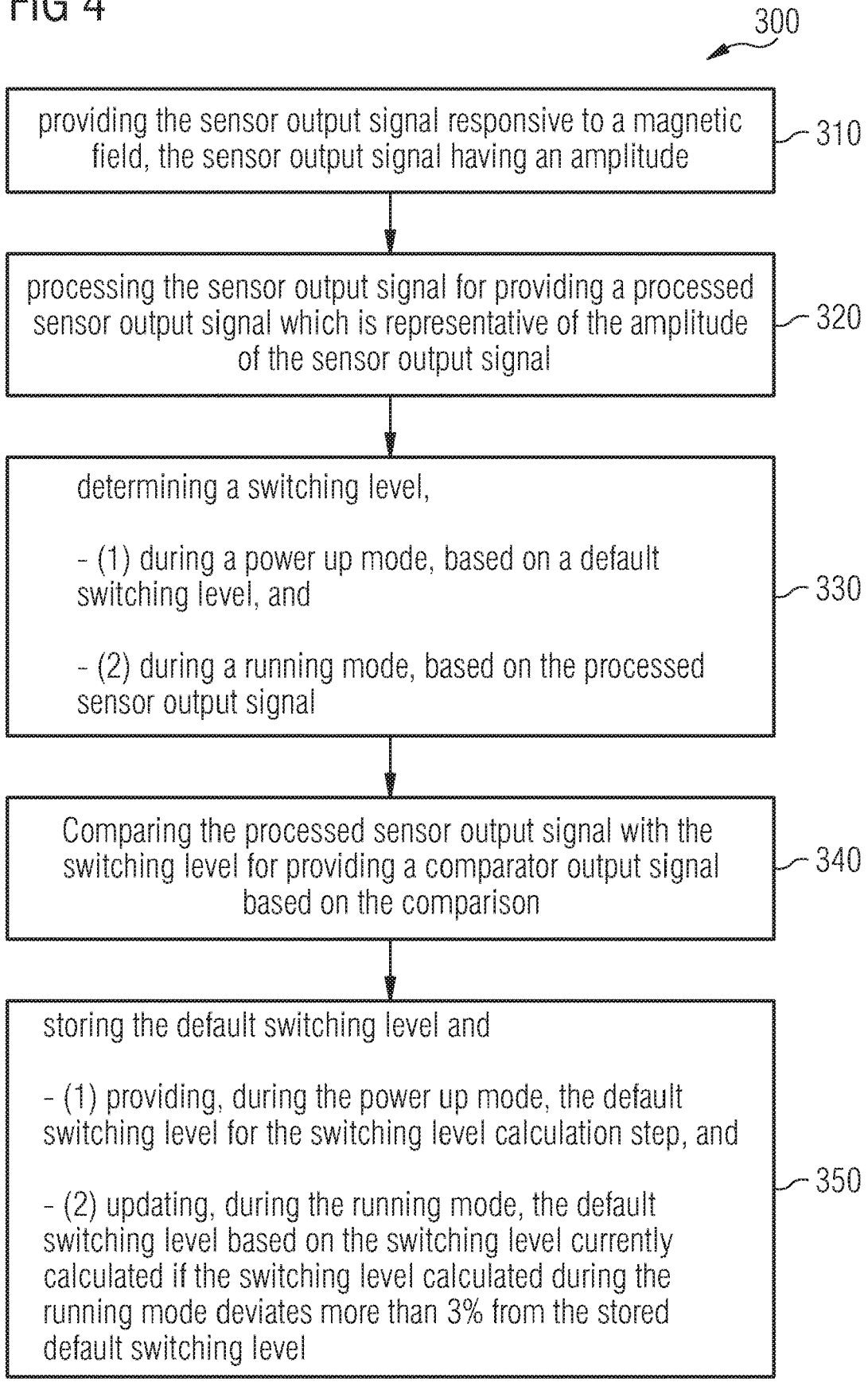
FIG. 4 shows a flow diagram of a method for processing a magnetic field sensor output signal according to a further embodiment.

In the following, a method 300 for processing a magnetic field sensor output signal shall now be described below with reference to FIG. 4. The method for processing a magnetic field sensor output signal, comprises the step 310 of providing the sensor output signal responsive to a magnetic field, the sensor output signal being representative or illustrative of a magnetic field amplitude; the step 320 of processing the sensor output signal for providing a processed sensor output signal which is representative of the sensor output signal, and, thus, of the magnetic field amplitude; the step 330 of determining/calculating a switching level, (1) during a power up mode, based on a default switching level, and (2) during a running mode, based on the processed sensor output signal; the step 340 of comparing the processed sensor output signal with the default switching level for providing a comparator output signal based on the comparison; and the step 350 of storing the default switching level and providing, during the power up mode, the default switching level for the switching level calculation step, and (2) updating, during the running mode, the default switching level based on the switching level currently calculated, if a difference between the switching level calculated during the running mode and the stored default switching level is higher than 3% of the magnetic field amplitude.

The amplitude of the magnetic field is influenced by a target wheel, wherein the default switching level is only updated during the running mode if the target wheel has a higher rotational speed than at least 100 rpm (200, . . . , 400 rpm). The step of updating may comprise the step of conducting a number of incremental update operations of the default switching level which is smaller than a pre-set number N, wherein N<=20 (15, 10 . . . ).

Moreover, a warning signal may be outputted, if the preset number N of update operations is achieved or exceeded. The warning signal may indicate a possible malfunction of the magnetic field sensor arrangement.

The method may comprise the further steps of (1) providing, during the running mode, a correction signal, which is based on an offset signal in the processed sensor output signal, and (2) feeding the correction signal into a chopper feedback loop for at least partially suppressing the offset signal in the processed sensor output signal, which can be conducted by a chopper offset calculation module in a chopper feedback loop 120-2, for example. The method may comprise the further steps of storing a correction value based on the correction signal, and providing, during the power up mode, the stored correction value as a starting value for correction signal during the power up mode. The method may comprise the further steps of feeding the correction signal into the chopper feedback loop for a ripple feedback suppression in the processed sensor output signal.

Moreover, the switching level calculated by a switching level calculation module during the running mode may be stored as the default switching level, wherein, during the running mode, the default switching level may be updated based on the calculated switching level. During the first power up mode, the default switching level may be updated based on the switching level calculated during the subsequent running mode.

The method may comprise the further steps of determining a number of teeth within the range of 1-12, for example, of the target wheel during running mode, and of storing this information in a storage module, wherein a different individual switching level may be used on each feature of the target wheel. It should be noted that the number of teeth may be also higher than 12.

The method may comprise the further steps of determining a current position of the target wheel, and of calculating at start-up an individual switching level (threshold) of the current edge/tooth for comparing it with the stored individual switching levels (thresholds).

The method may comprise the further steps of (1) providing, during the power up mode, the default individual switching levels to the switching level calculation module, and (2) updating, during the running mode, the default individual switching levels based on the currently calculated switching level, if the switching level calculated during the running mode deviates more than 3% from the stored default switching level for that determined feature of the target wheel compared to the detected peak-to-peak amplitude of the rendered or processed sensor output signal, i.e. if a difference between the switching level calculated during the running mode and the stored default switching level is higher than 3% of the amplitude of the sensor output signal.

The method may comprise the further steps of updating of the stored default switching level only after a defined number of target wheel rotations in order to prevent writing of wrong values in functional testing scenarios.

The method may comprise the further steps of updating of the stored default switching level only when the calculated switching level 152 has remained unchanged for a defined number of target wheel rotations. The method may comprise the further steps of updating of the stored default switching level only when the measured temperature is considered safe for the programming of the storage device.

A flag in a storage unit may indicate if the update of the default threshold in the storage unit occurred in safe supply conditions, wherein the old default threshold value may be stored for allowing a history of default threshold updates. The wherein flags or programmed validity fields in the storage module 170 may indicate which of multiple instances of stored default switching level 172 in the storage module 170 is usable as default switching level at start-up.

Thus, the present concept in form of the magnetic field sensor arrangement and the method for processing a magnetic field sensor output signal provide for an improved detection the phase accuracy of the first switch edges (based on a sensed magnetic field) after power-on of a magnetic sensor, e.g., a mono-cell magnetic cam sensor, when the sensor is mounted in the operating place, e.g., in a vehicle or car. Moreover, the calibrated switching level is stored/updated when the criteria of frequency and, for example, of deviation are met. Additionally the chopper stores the ripple feedback for a faster startup of the feedback loop.

To be more specific, in accordance with the present concept on the basis the functionality of the magnetic field sensor arrangement and the method for processing a magnetic field sensor output signal, respectively, an updated or calibrated switching level is stored/updated as the (new) default switching level based on the currently calculated switching level (or comparator threshold) when specific criteria of deviation between the default switching level and the currently calculated switching level are met. Moreover, the frequency or rotational speed of the monitored camshaft may be considered as further criterion for storing/updating the default switching level based on the currently calculated switching level (threshold). To achieve a sufficient accuracy after power on, the sensor arrangement stores the new default switching level, i.e. the newly calibrated switching level, which forms the default switching level during normal operation mode, if the currently stored switching level deviates more than 3% (e.g., more than 5% or 10%) from the ideal (i.e. the currently stored default) switching level compared to the detected peak-to-peak amplitude of the rendered or processed sensor output signal. Moreover, the calibrated switching level may optionally be stored/updated during the running mode only if the target wheel has a higher rotational speed than at least 100 rpm. Updating the default switching level only if the target wheel has achieved a minimum rotational speed is conducted to suppress the possibility to store wrong calibration values (default switching levels) generated by a high target wheel vibration (as the higher the rotational speed of the target wheel is the lower the effect to the calculated switching level is).

The number of self-programming operations (updates of the default switching level) can be stored incrementally and can be limited to a maximum number of, e.g., 10. Additionally, the chopper circuit may store the ripple feedback for a faster startup of the feedback of the feedback loop. To be more specific, as the chopper offset is stored, a more stable and faster restart of the ripple feedback suppression may be achieved.

Further, a "watchdog" (i.e. a device/circuitry that detects faults and initiates corrective actions) for a small signal detection may be implemented to recover for the case that at small signals after remount at a high air gap the sensor does not switch anymore. This may occur when the complete processed sensor signal is below the default switching level. At a wrong/missing switching detection, a fallback true power on (TPO) implementation can be activated. Another option may be to activate the calibration storage by a digital command applied with the supply modulation when the sensor is mounted.

Furthermore, the number of teeth of the target wheel can also be learned at the first power on. This makes the device more universal and the customer does not program anything. Alternatively, a fixed number of, e.g., 12 teeth can be assumed as this covers target wheels with 1, 2, 3, 4, 6 and 12 teeth which are the most common.

Moreover, the method may comprise the further step of outputting a warning signal, if the pre-set number N of update operations is achieved or exceeded. The method may comprise the further step of storing a correction value based on the correction signal, and providing, during the power up mode, the stored correction value as a starting value for correction signal during the power up mode.

The method may comprise the further step of feeding the correction signal into the chopper feedback loop for a ripple feedback suppression in the processed sensor output signal.

The method may comprise the further step of determining a number of features of the target wheel during running mode, and storing the determined number of features in a storage module.

The method may comprise the further step of using a different individual switching level on each feature of the target wheel. The method may comprise the further step of determining a current position of the target wheel, and calculating at start-up an individual switching level of the current feature for comparing it with the stored individual switching levels.

The method may comprise the further steps of (1) providing, during the power up mode, the default individual switching levels, and (2) updating, during the running mode, the default individual switching levels based on the currently calculated switching level, if the switching level calculated during the running mode deviates more than 3% of the magnetic field amplitude from the stored default switching level for the respective feature.

The method may comprise the further step of updating of the stored default switching level only after a defined number of target wheel rotations. The method may comprise the further step of updating of the stored default switching level only when the calculated switching level (152) has remained unchanged for a defined number of target wheel rotations. The method may comprise the further step of updating of the stored default switching level only when the measured temperature is considered safe for the programming of the storage device.

According to the method, the further step of setting a flag or a programmed validity field in a storage unit is conducted if the update of the default threshold in the storage unit occurred in a safe supply condition. According to the method, flags or programmed validity fields in the storage module (170) indicate which of multiple instances of stored default switching level (172) in the storage module (170) is usable as default switching level at start-up.

The method may comprise the further step storing the default threshold value for allowing a history of default threshold updates.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, one or more of the most important method steps may be executed by such an apparatus.

Depending on certain implementation requirements, embodiments can be implemented in hardware or in software or at least partially in hardware or at least partially in software. The implementation can be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments comprise a data carrier having electronically readable control signals, which are capable of cooperating with a programmable computer system, such that one of the methods described herein is performed.

Generally, embodiments can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the method is, therefore, a computer program having a program code for performing one of the methods described herein, when the computer program runs on a computer.

A further embodiment of the methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitory.

A further embodiment of the method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods may be performed by any hardware apparatus.

The apparatus described herein may be implemented using a hardware apparatus, or using a computer, or using a combination of a hardware apparatus and a computer.

The methods described herein may be performed using a hardware apparatus, or using a computer, or using a combination of a hardware apparatus and a computer.

The above described embodiments are merely illustrative for the principles of the present concept. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:

1. A magnetic field sensor arrangement, comprising:
   a magnetic field sensor element configured to provide a sensor output signal responsive to a magnetic field, wherein the sensor output signal is representative of a magnetic field amplitude,
   a processing module configured to process the sensor output signal and to provide a processed sensor output signal which is representative of the sensor output signal,
   a switching level calculation module configured to determine a first switching level, during a power up mode, based on a default switching level, and determine, during a running mode, a second switching level based on the processed sensor output signal;
   a comparator module configured to receive the first switching level and the second switching level, compare the processed sensor output signal with the first switching level during the power up mode, compare the processed sensor output signal with the second switching level during the running mode, and to provide a comparator output signal based on each comparison; and
   a storage module configured to:
      store the default switching level;
      provide, during the power up mode, the default switching level to the switching level calculation module;
      update, during the running mode, the default switching level based on the second switching level currently calculated by the switching level calculation module, if a difference between the second switching level calculated during the running mode and the stored default switching level is greater than a predetermined percentage of the magnetic field amplitude; and
      maintain, during the running mode, the default switching level as unchanged if the difference between the second switching level calculated during the running mode and the stored default switching level is equal to or less than the predetermined percentage of the magnetic field amplitude.

2. The magnetic field sensor arrangement according to claim 1, wherein the magnetic field is influenced by a target wheel, wherein the default switching level is updated during the running mode only if the target wheel has a rotational speed greater than at least 100 rpm.

3. The magnetic field sensor arrangement according to claim 2, wherein the switching level calculation module is also configured to determine a number of features of the target wheel during the running mode and to store the number of features in the storage module.

4. The magnetic field sensor arrangement according to claim 3, further comprising:
   a feature counter for determining a current position of the target wheel,
   wherein the switching level calculation module is configured to calculate, at startup, an individual switching level of a current feature and to compare the individual switching level with stored individual switching levels in order to match the feature counter with the current position of the target wheel.

5. The magnetic field sensor arrangement according to claim 4, wherein a different individual switching level is used on each feature, in the form of a tooth, an edge, or a notch of the target wheel.

6. The magnetic field sensor arrangement according to claim 5, wherein the storage module is configured to store all individual default switching levels and is further configured to provide, during the power up mode, the individual default switching levels to the switching level calculation module, and to update, during the running mode, the individual default switching levels based on the second switching level currently calculated by the switching level calculation module, if a difference between the second switching level calculated during the running mode and the stored default switching level is greater than the predetermined percentage of the magnetic field amplitude.

7. The magnetic field sensor arrangement according to claim 1, wherein the storage module is configured to conduct a number of incremental update operations of the default switching level which is smaller than a pre-set number N, wherein N≤20.

8. The magnetic field sensor arrangement according to claim 7, wherein a warning signal is output, if the pre-set number N of update operations is achieved or exceeded.

9. The magnetic field sensor arrangement according to claim 1, wherein the processing module comprises a chopper circuit with a chopper-offset-calculation module in a chopper feedback loop, wherein the chopper-offset-calculation module is configured to provide, during the running mode, a correction signal, which is based on an offset component in the processed sensor output signal, and to feed the correction signal into the chopper feedback loop for at least partially suppressing the offset component in the processed sensor output signal.

10. The magnetic field sensor arrangement according to claim 9, wherein the storage module is further configured to store a correction value based on the correction signal and to provide, during the power up mode, the stored correction value to the chopper-offset-calculation module.

11. The magnetic field sensor arrangement according to claim 10, wherein the chopper-offset-calculation module is configured to use the stored correction value as a starting value for a correction signal during the power up mode.

12. The magnetic field sensor arrangement according to claim 9, wherein the chopper-offset-calculation module is configured to feed the correction signal into the chopper feedback loop for a ripple feedback suppression in the processed sensor output signal.

13. The magnetic field sensor arrangement according to claim 1, wherein the second switching level calculated by the switching level calculation module during the running mode is stored as the default switching level.

14. The magnetic field sensor arrangement according to claim 1, further comprising:
an electronic control unit (ECU), wherein the ECU is configured to instruct the storage module to update, during the running mode, the default switching level based on the second switching level calculated by the switching level calculation module.

15. The magnetic field sensor arrangement according to claim 14, wherein the ECU is configured to instruct the storage module during the power up mode, to update the default switching level based on the second switching level during the running mode.

16. The magnetic field sensor arrangement according to claim 14, wherein the ECU is configured to instruct the storage module to update the default switching level when an external programming voltage is applied.

17. The magnetic field sensor arrangement according to claim 14, wherein the ECU is configured to instruct the storage module to update the default switching level when external conditions are considered safe for programming to be done based on an internal programming voltage coming from a charge pump.

18. The magnetic field sensor arrangement according to claim 1, wherein the processing module comprises a tracking ADC configured to provide a digital representation of the sensor output signal.

19. The magnetic field sensor arrangement according to claim 1, wherein the magnetic field sensor element comprises a Hall sensor element.

20. The magnetic field sensor arrangement according to claim 1, wherein the storage module is configured to update of the stored default switching level only after a defined number of target wheel rotations.

21. The magnetic field sensor arrangement according to claim 20, wherein the storage module is configured to update of the stored default switching level only when the calculated switching level has remained unchanged for a defined number of target wheel rotations.

22. The magnetic field sensor arrangement according to claim 1, wherein the storage module is configured to update of the stored default switching level only when a measured temperature is considered safe for programming.

23. The magnetic field sensor arrangement according to claim 1, wherein a flag or a programmed validity field in the storage module indicates whether the update of the default switching level in the storage module occurred in a safe supply condition.

24. The magnetic field sensor arrangement according to claim 1, wherein flags or programmed validity fields in the storage module indicate which of multiple instances of stored default switching levels in the storage module is usable as the default switching level at start-up.

25. The magnetic field sensor arrangement according to claim 1, wherein a discarded default threshold value is moved to a dedicated storage location of the storage module allowing to provide a history of the updated default switching levels.

* * * * *